US009153728B2

(12) United States Patent
Rohatgi et al.

(10) Patent No.: US 9,153,728 B2
(45) Date of Patent: *Oct. 6, 2015

(54) ION IMPLANTED SOLAR CELLS WITH IN SITU SURFACE PASSIVATION

(75) Inventors: Ajeet Rohatgi, Marietta, GA (US);
Vijay Yelundur, Canton, GA (US);
Vinodh Chandrasekaran, Suwanee, GA (US); Preston Davis, Atlanta, GA (US);
Ben Damiani, Atlanta, GA (US)

(73) Assignee: Suniva, Inc., Norcross, GA (US)

( * ) Notice: Subject to any disclaimer, the term of this patent is extended or adjusted under 35 U.S.C. 154(b) by 542 days.

This patent is subject to a terminal disclaimer.

(21) Appl. No.: 13/346,354

(22) Filed: Jan. 9, 2012

(65) Prior Publication Data

US 2012/0107998 A1      May 3, 2012

Related U.S. Application Data

(63) Continuation of application No. 12/793,363, filed on Jun. 3, 2010, now Pat. No. 8,110,431.

(51) Int. Cl.
*H01L 31/18* (2006.01)
*H01L 21/263* (2006.01)
(Continued)

(52) U.S. Cl.
CPC .......... *H01L 31/1804* (2013.01); *H01L 21/263* (2013.01); *H01L 21/266* (2013.01); *H01L 31/02363* (2013.01); *H01L 31/068* (2013.01);
(Continued)

(58) Field of Classification Search
USPC ............... 438/57, 87, 98, 514, 530, 542, 533;
257/E21.089, E21.135, E21.147,
257/E31.024
See application file for complete search history.

(56) References Cited

U.S. PATENT DOCUMENTS 4,676,845 A    6/1987  Spitzer ......................... 148/33.3
6,091,021 A    7/2000  Ruby et al.
(Continued)

FOREIGN PATENT DOCUMENTS

JP      1998-233518      5/1997
JP      2000-323735      11/2000
WO   WO 2009/152375   12/2009

OTHER PUBLICATIONS

Meemongkolkiat, V., et al., "Investigation of RTP and Belt Fired Screen Printed AL-BSF on Textured and Planar Back Surfaces of Silicon Solar Cells", 3rd World Conference on Photovoltaic Energy Conversion, Georgia Institute of Technology, May 11-18, 2003, 4 pages, USA.

(Continued)

*Primary Examiner* — Thomas L Dickey
(74) *Attorney, Agent, or Firm* — Ballard Spahr LLP

(57) ABSTRACT

Solar cells and methods for their manufacture are disclosed. An example method may include providing a substrate comprising a base layer and introducing n-type dopant to the front surface of the base layer by ion implantation. The substrate may be annealed by heating the substrate to a temperature to anneal the implant damage and activate the introduced dopant, thereby forming an n-type doped layer into the front surface of the base layer. Oxygen may be introduced during the annealing step to form a passivating oxide layer on the n-type doped layer. Back contacts may be screen-printed on the back surface of the base layer, and a p-type doped layer may be formed at the interface of the back surface of the base layer and the back contacts during firing of the back contacts. The back contacts may provide an electrical connection to the p-type doped layer.

20 Claims, 3 Drawing Sheets

Figure 1:
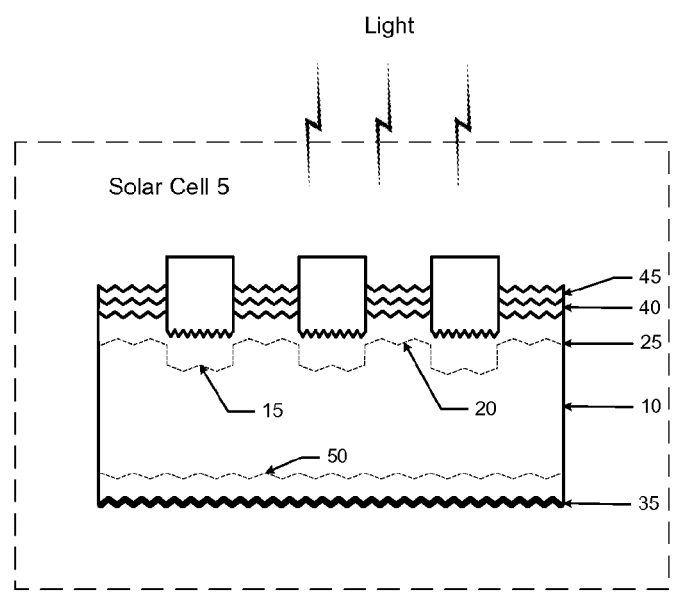

(51) Int. Cl.
*H01L 21/266* (2006.01)
*H01L 31/0236* (2006.01)
*H01L 31/068* (2012.01)
*H01L 21/265* (2006.01)

(52) U.S. Cl.
CPC ....... *H01L 31/1864* (2013.01); *H01L 21/26513* (2013.01); *Y02E 10/547* (2013.01)

(56) References Cited

U.S. PATENT DOCUMENTS

| | | | |
|---|---|---|---|
| 7,838,400 B2 | 11/2010 | Borden | 438/513 |
| 7,888,160 B2 | 2/2011 | Shen et al. | 438/72 |
| 8,110,431 B2* | 2/2012 | Rohatgi et al. | 438/98 |
| 2004/0112426 A1 | 6/2004 | Hagino | |
| 2005/0118802 A1* | 6/2005 | Tsao et al. | 438/663 |
| 2005/0252544 A1* | 11/2005 | Rohatgi et al. | 136/262 |
| 2009/0025786 A1 | 1/2009 | Rohatgi et al. | |
| 2009/0068783 A1 | 3/2009 | Borden | |
| 2009/0101202 A1 | 4/2009 | Sun et al. | |
| 2009/0142875 A1 | 6/2009 | Borden et al. | |
| 2009/0227061 A1 | 9/2009 | Bateman et al. | |
| 2009/0227062 A1 | 9/2009 | Sullivan et al. | |
| 2009/0227094 A1 | 9/2009 | Bateman et al. | |
| 2009/0227095 A1 | 9/2009 | Bateman et al. | |
| 2009/0227097 A1 | 9/2009 | Bateman et al. | |
| 2009/0308439 A1 | 12/2009 | Adibi et al. | |
| 2009/0308440 A1 | 12/2009 | Adibi et al. | |
| 2009/0308450 A1 | 12/2009 | Adibi et al. | |
| 2009/0309039 A1 | 12/2009 | Adibi et al. | |
| 2009/0317937 A1 | 12/2009 | Gupta et al. | |
| 2010/0015749 A1 | 1/2010 | Borden | 438/72 |
| 2010/0015750 A1 | 1/2010 | Shen et al. | 438/72 |
| 2010/0037939 A1* | 2/2010 | Eickelmann et al. | 136/255 |
| 2010/0041176 A1 | 2/2010 | Sullivan et al. | |
| 2010/0059362 A1 | 3/2010 | Anella | |
| 2010/0075485 A1 | 3/2010 | Rana et al. | |
| 2010/0124799 A1 | 5/2010 | Blake et al. | |
| 2010/0197125 A1 | 8/2010 | Low et al. | |
| 2010/0197126 A1 | 8/2010 | Bateman et al. | |
| 2010/0224240 A1 | 9/2010 | Bateman et al. | |
| 2010/0297782 A1 | 11/2010 | Riordon et al. | |
| 2010/0308236 A1 | 12/2010 | Carlson et al. | |
| 2010/0314559 A1 | 12/2010 | Vopat et al. | |
| 2011/0039367 A1 | 2/2011 | Bateman et al. | |
| 2011/0089342 A1 | 4/2011 | Daniels et al. | |
| 2011/0089343 A1 | 4/2011 | Daniels et al. | |
| 2011/0092059 A1 | 4/2011 | Daniels et al. | |
| 2011/0097840 A1 | 4/2011 | Ramappa | |
| 2011/0104618 A1 | 5/2011 | Bateman et al. | |
| 2011/0177652 A1 | 7/2011 | Gupta et al. | |
| 2011/0180131 A1 | 7/2011 | Mullin et al. | |

OTHER PUBLICATIONS

Ebong, A., et al., "Development of Front Silver Paste for Producing Fine Lines and High Quality Contacts to 100Ω/SQ Emitters With Low Surface Phosphorus Concentration", 23$^{rd}$ European Photovoltaic Solar Energy Conference, Sep. 1-5, 2008, pp, 1713-1716, Valencia.

Antoniadis, H., "Silicon Ink High Efficiency Solar Cells", 34$^{th}$ IEEE Photovoltaic Specialists Conference (PVSC), 2009, pp. 650-654, IEEE, USA.

Monna, R., et al., "17.8% Efficiency Obtained on C-Si Solar Cells Using a Selective Emitter Industrial Type Process", 23$^{rd}$ European Photovoltaic Solar Energy Conference, Sep. 1-5, 2008, 4 pages, Valencia.

Book, F., et al., "Two Diffusion Step Selective Emitter: Comparison of Mask Opening by Laser or Etching Paste", 23$^{rd}$ European Photovoltaic Solar Energy Conference, Sep. 1-5, 2008, 4 pages, Valencia.

Dastgheib-Shirazi, A., et al., "Selective Emitter for Industrial Solar Cell Production: A Wet Chemical Approach Using a Single Side Diffusion Process", 23$^{rd}$ European Photovoltaic Solar Energy Conference, Sep. 1-5, 2008, 3 pages.

Röder, T., et al., "0.4% Absolute Efficiency Gain of Industrial Solar Cells by Laser Doped Selective Emitter", 34$^{th}$ IEEE Photovoltaic Specialists Conference (PVSC), Jun. 7-12, 2009, pp. 871-873, Philadelphia.

Jeon, M., et al., "Emitter Formation Using Ion Implatation Method for Fabrication of Crystalline Silicon Solar Cells", 25$^{th}$ European Photovoltaic Solar Energy Conference, Sep. 6-10, 2010, pp. 2438-2441, Valencia.

Westbrook, R. D., et al, "Glow-Discharge-Implanted, Thermally Annealed, Oxide-Passivated Silicon Solar Cells of 19% Efficiency", Applied Physics Letters, Feb. 23, 1987, pp. 469-471, vol. 50, No. 8, USA.

Douglas, E. C., et al., "A Study of the Factors Which Control the Efficiency of Ion-Implanted Silicon Solar Cells", IEEE Transactions on Electron Devices, Apr. 1980, pp. 792-802, vol. 27, No. 4, USA.

Minnucci, J. A., et al., "Tailored Emitter, Low-Resistivity, Ion-Implanted Silicon Solar Cells", IEEE Transactions on Electron Devices, Apr. 1980, pp. 802-806, vol. 27, No. 4, USA.

Spitzer, M. B., et al., "High-Efficiency Ion-Implanted Silicon Solar Cells", IEEE Transactions on Electron Devices, May 1984, vol. 31, No. 5, pp. 546-550, USA.

Keavney, C. J., et al., "Solar Cell Junction Profiles in Ion-Implanted Texture-Etched Surfaces", Journal of Applied Physics, Jul. 15, 1984, pp. 592-593, vol. 56, No. 2, USA.

Gupta, A., et al., "High Efficiency Selective Emitter Cells Using In-Situ Patterned Ion-Implantation", 25$^{th}$ European Photovoltaic Solar Energy Conference, Sep. 6-10, 2010, pp. 1158-1162, Valencia.

United States Patent and Trademark Office, Office Action for U.S. Appl. No. 12/793,363, mailed Jun. 20, 2011, 17 pages, USA.

United States Patent and Trademark Office, Notice of Allowance and Fee(s) Due for U.S. Appl. No. 12/793,363, mailed Oct. 5, 2011, 8 pages, USA.

International Searching Authority, International Search Report and Written Opinion for International Application No. PCT/US2011/036602, mailed Jul. 2, 2012, 16 pages, Europear Patent Office, The Netherlands.

Janssens, T., et al., "Advanced Phosphorus Emitters for High Efficiency SI Solar Cells," 24$^{th}$ European Photovoltaic Solar Energy Conference, Sep. 21-25, 2009, pp. 1843-1846, Germany.

Németh, Á, et al., Study of Crystal Defects in Plasma Doped Silicon Solar Cells, 21$^{st}$ European Photovoltaic Solar Energy Conferency, Sep. 4-8, 2006, pp. 1400-1403, Germany.

Bultman, J., et al., Methods of Emitter Formation for Crystalline Silicon Solar Cells, Photovoltaics International 8$^{th}$ Edition, May 31, 2010, pp. 69-80, UK.

Müller, M., et al., "Silicon LPE on Suststrates from Metallurgical Silicon Feedstock for Large Scale Production," 3$^{rd}$ World Conference on Photovoltaic Energy Conversion, May 11-18, 2003, pp. 1221-1224, Japan.

Rohatgi, A., et al., Developing Novel Low-Cost, High-Throughput Processing Techniques for 20%-Efficient Monocrystalline Silicon Solar Cells, Photovoltaics International 10$^{th}$ Edition, Nov. 30, 2010, pp. 87-93, UK.

International Preliminary Examining Authority, Second Written Opinion and Notification Concerning Informal Communications with the Applicant for International Application No. PCT/US2011/036602, Nov. 8, 2012, 8 pages, European Patent Office, Germany.

Reason of Rejection issued by the Japanese Patent Office on Nov. 26, 2013 for Application No. JP 2013-513195 filed on May 16, 2011 (Applicant—Suniva, Inc.//Inventors—Rohatgi et al.//)(7 pages).

Final Decision of Rejection issued by the Japanese Patent Office on Oct. 7, 2014 for Application No. JP 2013-513195 filed on May 16, 2011 (Applicant—Suniva, Inc.//Inventors—Rohatgi et al.//)(5 pages).

Taiwanese Office Action dated Dec. 8, 2014 (translated into English)(7 pages).

* cited by examiner

ION IMPLANTED SOLAR CELLS WITH IN SITU SURFACE PASSIVATION

CROSS-REFERENCE TO RELATED APPLICATIONS

This application is a continuation of co-pending U.S. application Ser. No. 12/793,363, filed Jun. 3, 2010, which is hereby incorporated herein in its entirety by reference.

TECHNOLOGICAL FIELD

The present invention is generally directed to a solar cell formed by ion implantation and in situ surface passivation, and methods for its manufacture.

BACKGROUND

In basic design, a solar cell is composed of a material such as a semiconductor substrate that absorbs energy from photons to generate electricity through the photovoltaic effect. When photons of light penetrate into the substrate, the energy is absorbed and an electron previously in a bound state is freed. The released electron and the previously occupied hole are known as charge carriers.

The substrate is generally doped with p-type and n-type impurities to create an electric field inside the solar cell, called a p-n junction. In order to use the free charge carriers to generate electricity, the electrons and holes must not recombine before they can be separated by the electrical field at the p-n junction. The charge carriers that do not recombine can then be used to power a load.

A common method for producing solar cells begins with a substrate doped to have p-type conductivity. An n-type dopant is introduced to the front surface of the substrate to form an n-type emitter layer on top of a p-type base layer. Contacts are then formed on the front surface of the emitter layer and back surface of the base layer to allow electrical connections to be made. The free electrons are collected by the front contacts and the holes are collected by the back contacts.

Since the front contacts block some of the incident sunlight, it is advantageous not to cover too much of the front surface of the emitter layer with the contact material. Instead, a traditional approach involves forming contact points, lines, or grids. Some low-cost solutions for forming these contacts, such as screen-printing, may require heavily doping the emitter layer to reduce contact resistance between the front contacts and the underlying emitter layer. The use of heavy doping, however, increases charge carrier recombination in the emitter layer and at the emitter layer surface, which leads to a reduction in overall cell efficiency.

To overcome this disadvantage, various techniques may be used to form an emitter layer that is doped relatively heavily underneath the front contacts and relatively lightly in the exposed regions between the front contacts, which is known as a selective emitter. The manufacturing processes used to produce solar cells with selective emitters, however, have historically been inefficient, and the resulting solar cells fail to realize their desired potential for efficiency.

Therefore, there is a need in the art for producing selective emitter solar cells that overcome the above-mentioned and other disadvantages and deficiencies of previous technologies.

BRIEF SUMMARY OF SOME EXAMPLES OF THE INVENTION

Various embodiments of a silicon solar cell with ion implanted doped layers and high-quality in situ passivation layer formed in a single anneal cycle and methods for its manufacture are herein disclosed. These embodiments of the invention overcome one or more of the above-described disadvantages associated with previous technologies. Embodiments of the invention provide several advantages for production of solar cells that reduce the time and cost required for their production.

A solar cell according to an example embodiment of the invention comprises a silicon substrate having a p-type base layer. The solar cell has an n-type emitter layer formed over the p-type base layer by ion implantation. The emitter layer is a selective emitter having one or more first doped regions and one or more second doped regions. The one or more second doped regions are more heavily doped than the one or more first doped regions. The solar cell also has a p-n junction at the interface of the p-type base layer and the emitter layer. A passivating oxide layer is formed on the front surface of the emitter layer. The p-n junction and passivating oxide layer are formed during a single anneal cycle.

A solar cell according to another example embodiment of the invention comprises a monocrystalline silicon substrate having a boron-doped p-type base layer. The solar cell has a phosphorus doped emitter layer formed by two ion implantation steps on the front surface of the base layer. The emitter layer is a selective emitter having a first doped region formed during the first ion implantation step and a second doped region formed during the second ion implantation step. The second doped region is more heavily doped than the first doped region due to either the use of a higher dose of dopant or any additive dopant during the second ion implantation step. The solar cell also has a p-n junction at the interface of the front surface of the base layer and the back surface of the emitter layer, which is formed when the substrate is subjected to a single anneal cycle. A front passivating oxide layer, such as a dielectric, silicon dioxide passivating layer, is formed on the front surface of the emitter layer and a back passivating oxide layer, such as a dielectric, silicon dioxide passivating layer, is formed on the back surface of the base layer. The front passivating oxide layer and back passivating oxide layer are formed during the same single anneal cycle that forms the p-n junction referenced above. An antireflection layer, such as silicon nitride, aluminum oxide, titanium oxide, magnesium fluoride, or zinc sulfide, or combinations of these materials, is formed on the front surface of the front passivating oxide layer. One or more screen-printed, silver front contacts are formed on the antireflection layer and one or more screen-printed, aluminum back contacts are formed on the back surface of the base layer. An aluminum-doped $p^+$ silicon layer is formed by liquid phase epitaxial regrowth at the interface of the back surface of the base layer and the one or more back contacts. The one or more front contacts are aligned with the more heavily doped second doped region of the emitter layer to reduce contact resistance.

According to an example embodiment of the invention, a method is disclosed for manufacturing a silicon solar cell with ion implanted selective emitter and high-quality in situ passivation layer formed in a single anneal cycle. The method begins by providing a silicon substrate comprising a boron-doped p-type base layer. Phosphorus dopant is uniformly introduced to the front surface of the base layer in order to lightly dope both a first region and a second region of the front surface of the base layer by ion implantation during a first implantation step. Additional dopant is introduced to the second region of the front surface of the base layer through a mask by ion implantation during a second implantation step. The second region is, therefore, more heavily doped than the first region. The substrate is subjected to a single high-temperature anneal cycle in a furnace to heal the implant damage, activate the phosphorus dopant from the first and second regions, and drive the phosphorus dopant from the first and second regions to a desired junction depth. A selective emitter layer is formed on the front surface of the base layer due to the different amount of doping in the first and second regions. During the same anneal cycle, oxygen is also introduced into the furnace to help form a passivating oxide layer on the front surface of the selective emitter layer and a passivating oxide layer on the back surface of the base layer. The passivating oxide layers, such as dielectric, silicon dioxide passivating layers, may be formed in situ due to the fact that the use of ion implantation eliminates the need to remove phosphosilicate glass prior to forming an oxide layer.

The method also comprises depositing an amorphous silicon nitride layer on the front surface of the front passivating oxide layer thereby forming an antireflection coating from the combination of the amorphous silicon nitride layer and the front passivating oxide layer. One or more front silver contacts are screen-printed on the amorphous silicon nitride layer in alignment with the more heavily doped ion implanted second region of the front surface of the base layer. One or more front silver connections, such as solderable pads or bus bars, are also screen-printed on the amorphous silicon nitride layer. One or more back silver-aluminum connections, such as solderable pads or bus bars, are screen-printed on the back surface of the base layer. An aluminum back contact is screen-printed on the back surface of the base layer. The front and back contacts and connections are co-fired in a belt furnace so that the front and back contacts and connections fire through the antireflection and/or passivating oxide layers. The one or more front contacts are in electronic communication with the selective emitter layer through the amorphous silicon nitride layer and the front passivating oxide layer. An aluminum-doped p$^+$ silicon layer is formed by liquid phase epitaxial regrowth at the interface of the back surface of the base layer and the back contact during the co-firing of the front and back contacts.

According to another example embodiment of the invention, a method is disclosed for manufacturing a solar cell with ion implanted selective emitter and high-quality in situ passivation layer formed in a single anneal cycle. The method begins by providing a substrate comprising a p-type base layer. Dopant is introduced to at least a first region of the front surface of the p-type base layer by ion implantation. Also, dopant is introduced to at least a second region of the front surface of the p-type base layer by ion implantation. The second region is more heavily doped than the first region. Additionally, the dopant introduced to the first and second regions is of n-type conductivity. The substrate is annealed. During the annealing, the substrate is heated in a furnace to a temperature to anneal the implant damage, activate dopant from the first and second regions, and drive the dopant from the first and second regions deeper into the substrate, thereby forming a selective emitter layer on the front surface of the p-type base layer. Oxygen is introduced into the furnace during the anneal step. A passivating oxide layer is formed on at least the front surface of the selective emitter layer.

Another example embodiment of the invention is directed to a solar cell with ion implanted selective emitter and high-quality in situ passivation layer formed in a single anneal cycle formed with the above-identified method.

The above summary is provided merely for purposes of summarizing some example embodiments of the invention so as to provide a basic understanding of some aspects of the invention. Accordingly, it will be appreciated that the above described example embodiments should not be construed to narrow the scope or spirit of the invention in any way more restrictive than as defined by the specification and appended claims. It will be appreciated that the scope of the invention encompasses many potential embodiments, some of which will be further described below, in addition to those here summarized.

BRIEF DESCRIPTION OF THE DRAWING(S)

Figure 2A:
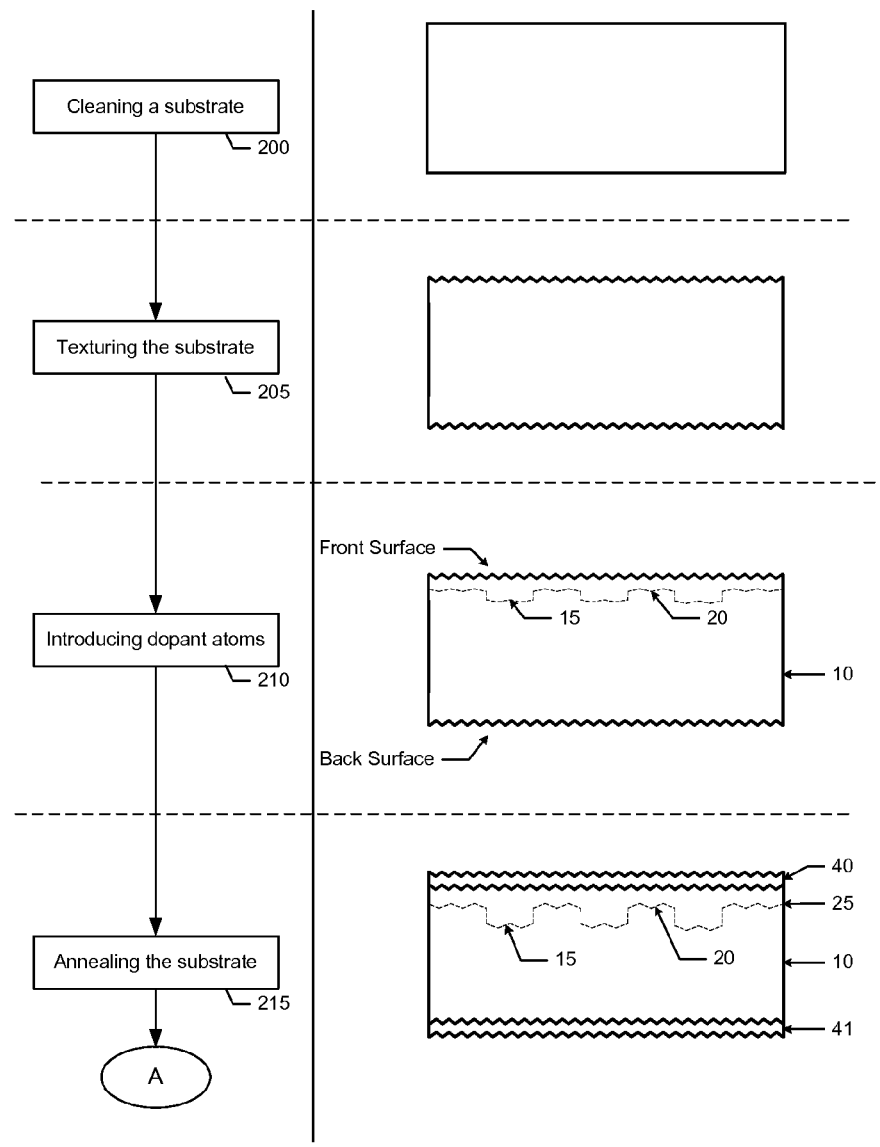
Figure 2B:
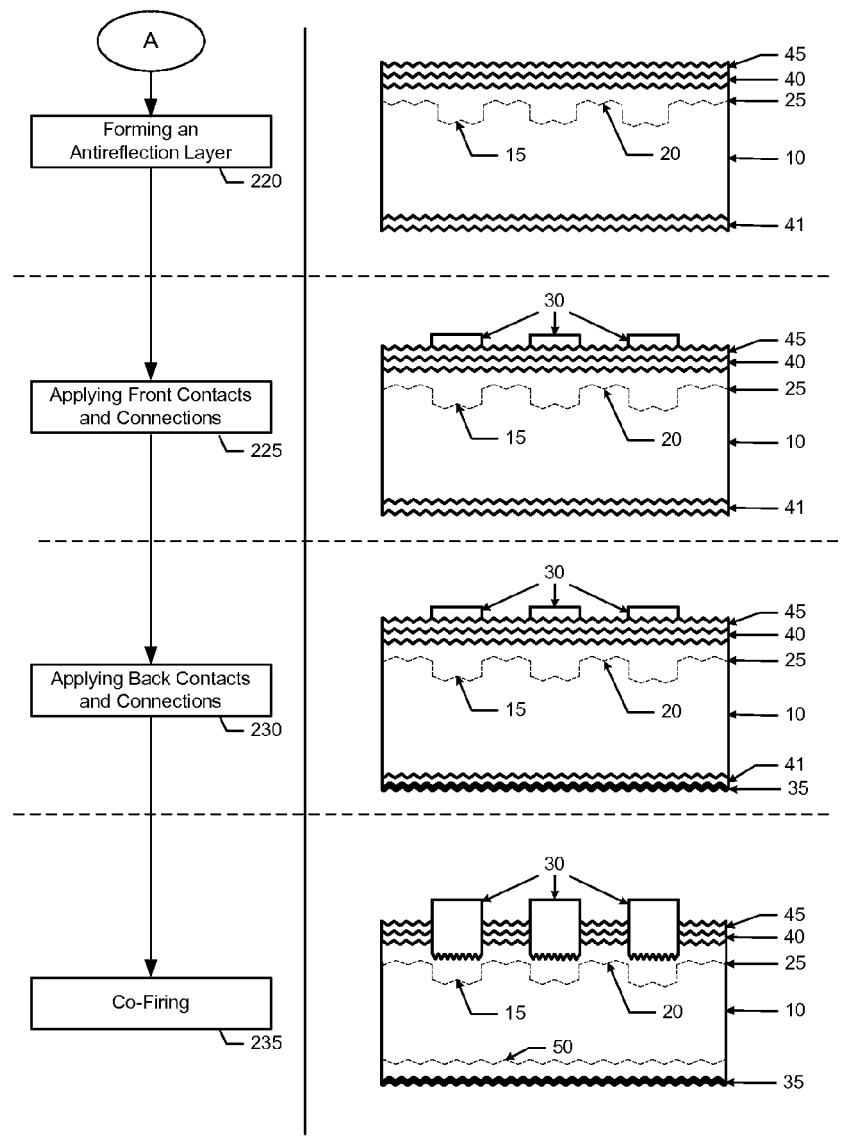

Having thus described embodiments of the invention in general terms, reference will now be made to the accompanying drawings, which are not necessarily drawn to scale, and wherein:

FIG. 1 illustrates a cross-sectional view of a solar cell in accordance with an example embodiment of the present invention; and FIGS. 2a and 2b illustrate a flowchart according to an example embodiment of a method for manufacturing a solar cell of the present invention.

DETAILED DESCRIPTION

Some embodiments of the present invention will now be described more fully hereinafter with reference to the accompanying drawings, in which some, but not all embodiments of the invention are shown. Those skilled in this art will understand that the invention may be embodied in many different forms and should not be construed as limited to the embodiments set forth herein; rather, these embodiments are provided so that this disclosure will satisfy applicable legal requirements. Like reference numerals refer to like elements throughout.

Selective emitter structures help bridge the gap between high-efficiency, expensive silicon solar cells made in the laboratory and low-cost, but lower efficiency, cells manufactured in industry. Most industrial silicon solar cells utilize low-cost, screen-printed metal contacts that require heavily doped emitter layers in order to reduce contact resistance to acceptable levels, for example less than 5 mΩ-cm$^2$. Silicon solar cells with heavily doped uniform emitters, however, suffer from increases in charge carrier recombination in the emitter and at the emitter surface, which leads to a loss in solar cell efficiency. The recombination may be reduced by utilizing selective emitters, which feature heavy doping under the contacts and light doping between the contacts.

The inventors have recognized that the addition of a high-quality, passivating oxide layer significantly enhances the performance of selective emitter cells. Adding a high-quality, passivating oxide layer to a selective emitter solar cell, however, requires additional time, energy, and costs during the manufacturing process. For example, in conventional solar cell processing with liquid dopant sources, such as phosphorus oxychloride (POCl$_3$), a phosphosilicate glass (PSG) layer forms on the surface of the substrate during the diffusion of the dopant. This glass must be removed from the surface of the substrate, typically by immersion in dilute hydrofluoric acid, before a passivating oxide layer may be formed. Therefore, if a passivating oxide layer is to be included in selective emitter structures made by dopant diffusion, it is conventionally grown during a second high-temperature step, for example at 800 to 1000 degrees Celsius, after phosphosilicate glass removal. Moreover, the liquid dopant approach may require two separate diffusions including an additional step between the diffusions for deposition of a protective silicon nitride layer and patterning with a dielectric etch paste to form the selective emitter. These additional steps increase the time and cost of producing solar cells.

Furthermore, selective emitter solar cells formed by liquid dopant diffusion having passivating oxide layers also suffer from additional drawbacks that the present invention avoids. Liquid dopant diffusion inherently results in the formation of n+ doped layers on both front and rear sides of the silicon wafer. As a result, a junction edge isolation step must be performed in the fabrication of solar cells with emitters formed by liquid dopant diffusion to disconnect this electrical shunt path between the front and rear along the edges of the cell. This junction edge isolation is typically achieved by formation of a trench by laser, plasma, or chemical methods. The formation of a trench during junction edge isolation decreases the active area of the cell by approximately 1% and cell efficiency by approximately 0.2% absolute. Additionally, the formation of n+ doped layers on both sides of the wafer during liquid dopant diffusion prevents the deployment of advanced back surface passivation schemes.

Selective emitters formed by ion implantation allow for more uniform incorporation of dopant, do not involve the formation of phosphosilicate glass, and eliminate the need for edge isolation. Subjecting the solar cells to an additional high-temperature anneal typically needed to form an oxide layer, though, not only introduces inefficiencies to the manufacturing process, but also may further drive the ion implanted dopants into the substrate thereby affecting the desired dopant profile.

The inventors have discovered a new approach to producing a solar cell with a selective emitter and high-quality, passivating oxide layer that solves a number of the problems described above. The process involves using ion implantation to dope the field and selective regions and introducing oxygen to the furnace during the anneal stage used to activate and drive in the implanted dopant. In this way, the desired selective emitter and high-quality, passivating oxide are both formed in a single high temperature anneal step. As a result, high-volume, module-ready solar cells may be produced using streamlined and industrial level only processes. The resultant solar cells may have average cell efficiencies of 18.5% to 19% and potential efficiencies of about 20% on 156 millimeter pseudosquare substrates.

FIG. 1 illustrates one embodiment of a solar cell 5 in accordance with the present invention. The solar cell 5 may be formed of a semiconductor substrate. The substrate may be composed of silicon (Si), germanium (Ge) or silicon-germanium (SiGe) or other semiconductive material, or it may be a combination of such materials. In the case of monocrystalline substrates, the semiconductor substrate may be grown from a melt using Float Zone (FZ) or Czochralski (Cz) techniques. The resulting monocrystalline boule may then be sawn into a wafer which may be polished to form the substrate. For a substrate composed of silicon, germanium or silicon-germanium, the crystallographic orientation of the wafer surface may be (100) or (110), for example. Alternatively, the substrate can be multi-crystalline, which may be less expensive than monocrystalline substrates. However, the multi-crystalline substrate suffers from recombination of charge carriers at crystal grain boundaries, and requires passivation to avoid efficiency losses.

The front and back surfaces of the substrate may define pyramidal structures created by their treatment with a solution of potassium hydroxide (KOH) and isopropyl alcohol (IPA) during an anisotropic etching process. The presence of these structures increases the amount of light entering the solar cell 5 by reducing the amount of light that is lost by reflection from the front surface. The pyramidal structures on the back surface may be destroyed during formation of a back contact.

According to the embodiment of FIG. 1, the substrate may be doped with impurities of a first conductivity type, for example p-type impurities, to create a p-type base layer 10. If the substrate is composed of silicon (Si), germanium (Ge) or silicon-germanium (Si-Ge), the p-type base layer 10 may be doped with boron (B), gallium (Ga), indium (In), aluminum (Al), or possibly another Group III element. Alternatively, the substrate may be doped with phosphorus (P), antimony (Sb), arsenic (As) or other Group V element to induce n-type conductivity, thereby forming an n-type base layer. A selective emitter layer made up of heavily doped regions 15 and lightly doped regions 20 may be formed on the front surface of the p-type base layer 10, for example by ion implantation. The heavily doped regions 15 and lightly doped regions 20 may be doped with impurities of a second conductivity type opposite that of the first conductivity type, for example n-type impurities. A p-n junction 25 may be formed at the interface between the p-type base layer 10 and the doped regions 15, 20. Because of their opposite conductivities, the p-type base layer 10 and the doped regions 15, 20 create an electric field across the p-n junction 25 which separates free electrons and holes resulting from absorption of light photons and forces them to move in opposite directions to respective front and back contacts 30, 35.

The front surface of the doped regions 15, 20 of the selective emitter layer and back surface of the p-type base layer 10 represent a discontinuity in their crystalline structures, and dangling chemical bonds are present at these exposed surfaces. The dangling bonds constitute recombination centers which disadvantageously annihilate charge carriers, thus lowering the efficiency of the solar cell. To prevent this from occurring, in some embodiments, oxide layers 40, 41 may be formed on both the front surface of the doped regions 15, 20 of the selective emitter layer and the back surface of the p-type base layer 10. In doing so, a passivating oxide layer may form on the entire exposed wafer surface, including on the thin sides of the wafer that define its thickness.

The oxide layers 40, 41 may contact the front surface of the doped regions 15, 20 of the selective emitter and the back surface of the p-type base layer 10 in order to chemically satisfy the bonds of the atoms at these interfaces so that they will not annihilate charge carriers. The oxide layers 40, 41 may comprise a dielectric material such as silicon dioxide ($SiO_2$) for a silicon substrate, or an oxide of another semiconductor type, depending upon the composition of the substrate. The oxide layers 40, 41 may have thicknesses in a range from 5 to 150 nanometers. For example, 20 nanometers may be used. By passivating the dangling silicon bonds on the surfaces of the substrate, the oxide layers 40, 41 may reduce the surface recombination velocity and decrease the emitter component of the reverse saturation current density ($J_{oe}$), thus improving the overall efficiency of the solar cell 5. Additionally, in certain embodiments, the oxide layer 41 formed on the back surface of the p-type base layer 10 may advantageously produce a high-quality, dielectric-passivated back surface, for example when capped with a silicon nitride layer.

An antireflection layer 45 may be formed on the oxide layer 40 on the front surface of the doped regions 15, 20 of the selective emitter layer to reduce reflection of the incident light and thus loss of solar energy. The antireflection layer 45 may have a refractive index greater than that of the oxide layer 40, which tends to cause light incident to the solar cell to refract into the antireflection layer 45 and through the oxide layer 40 to the substrate where it can be converted to free charge carriers. For example, the antireflection layer 45 may have an index of refraction in the range of 1.9 to 2.4 when measured with an incident laser having a wavelength of 632.8 nm. The antireflection layer 45 may be composed of silicon nitride ($SiN_x$), aluminum oxide ($Al_2O_3$), titanium oxide ($TiO_2$), magnesium fluoride ($Mg_2F$), zinc oxide (ZnO), or zinc sulfide ($ZnS_2$), or combinations of these materials. In some embodiments, the antireflection layer 45 comprises an amorphous nitride, such as amorphous silicon nitride ($a-SiN_x$). The antireflection layer 45 may have a thickness from 10 to 100 nanometers.

The front and back contacts 30, 35 and front and back connections may be formed of conductive materials such as silver (Ag), aluminum (Al), or a combination of silver and aluminum. Generally, for silicon and other substrates, silver may be used to contact the surface of the substrate that is doped n-type, such as the doped regions 15, 20 of the selective emitter layer, and aluminum, silver, or silver with aluminum additive may be used to contact the surface of the substrate that is doped p-type, such as the p-type base layer. Direct contact of metal to a semiconductor increases the recombination rate of electrons and holes, which can significantly lower solar cell efficiency. To decrease this effect and limit the proportion of metal covering the surface of the substrate, the front and back contacts 30, 35 and connections may be configured as point or line contacts (sometimes called "local contacts"). The spacing and arrangement of point or line contacts can be determined as described in U.S. Publication No. 2009/0025786 published Jan. 29, 2009, which is incorporated by reference as if set forth in full herein.

The front and back contacts 30, 35 and connections may be formed by screen-printing the silver on the front surface of the antireflection layer 45 and the aluminum, silver, or silver with aluminum additive on the back surface of the p-type base layer 10 or back passivating oxide layer 41. The front and back connections may comprise solderable pads or bus bars to facilitate electrical connections to the front and back surfaces of the solar cell 5. According to example embodiments, the pattern of the front connections may be aligned with the pattern of the back connections.

In addition, for the front contacts 30 and front connections, silver may be selected because of its high electrical conductivity to limit shadowing effects that can lower solar cell efficiency. Various commercial silver pastes are available for this purpose, such as Heraeus SOL953. However, silver is not transparent, so it may be desirable to limit the dimensions of the front contacts 30 and front connections to point or line contacts of limited area for this additional reason. To reduce the contact resistance between the front contacts 30 and the underlying selective emitter layer, the front contacts 30 are aligned with the heavily doped regions 15 of the selective emitter layer. In certain embodiments, the width of the front contacts 30 may be less than the width of the heavily doped regions 15 to ensure that the front contacts 30 are entirely within the heavily doped regions 15. The heavy doping in these selective regions also may increase the depth of the p-n junction 25 underneath, which may prevent shunting or firing through the p-n junction 25 by components of the metal paste used to form the front contacts 30. In accordance with certain embodiments, the oxide layer 40 and the antireflection layer 45 may be disposed on the front surface of the doped regions 15, 20 of the selective emitter layer prior to forming the front contacts 30 and front connections. In this case, the front contacts 30 and front connections may physically penetrate the oxide layer 40 and the antireflection layer 45 to make contact with the underlying regions of the selective emitter layer. The front contacts 30 and front connections may contain glass frit in addition to metal to facilitate their firing through the oxide layer 40 and the antireflection layer 45 to make contact with the selective emitter layer.

The back contact 35 and back connections may be formed on the back surface of the p-type base layer 10 using screen printed pastes. The paste used to form the back contact 35 may comprise an aluminum paste, such as Monocrystal Analog 12D, or the like. Additionally, the paste used to form the back connections may comprise an aluminum-silver paste, such as Monocrystal PPAS-7-1, or the like. According to example embodiments, the back connections may be applied to the back surface of the p-type base layer 10 prior to the application of the back contact 35. The back contact 35 may be printed to overlap the edges of the back connections while leaving a portion of the back connections exposed. In some embodiments, the back contact 35 and back connections may cover nearly the entire back surface of the p-type base layer 10. Alternatively, the back contact 35 and back connections may only cover a portion of the back surface of the p-type base layer 10. In accordance with certain embodiments, the oxide layer 41 may be disposed on the back surface of the p-type base layer 10 prior to forming the back contact 35 and back connections. In this case, the back contact 35 and back connections may physically penetrate the oxide layer 41 to make contact with the back surface of the p-type base layer 10. The oxide layer 41 may be consumed by glass fit in the pastes during formation of the back contact 35 and back connections.

Due to the firing of the back contact 35, an aluminum-doped $p^+$ silicon layer 50 may be formed by liquid phase epitaxial regrowth at the interface of the back surface of the p-type base layer 10 and the back contact 35. In these embodiments, the back contact 35 may make electrical contact with the back surface of the aluminum-doped $p^+$ silicon layer 50. The back contact 35 may be composed of an aluminum-silicon eutectic composition. The back contact 35 may also serve as a reflective back layer for the solar cell 5. Having a reflective back layer provides a reflective surface to return incident light reaching the back to the substrate where it can generate free charge carriers. The thickness of the back contact 35 may be from 10 to 40 micrometers in thickness and provide adequate reflectivity.

FIGS. 2a and b illustrate a flowchart according to an example method for manufacturing another example solar cell with ion implanted selective emitter and high-quality in situ passivation layer formed in a single anneal cycle according to an example embodiment of the present invention. FIGS. 2a and b thus disclose the methods for its manufacture in accordance with the present invention.

Referring to FIGS. 2a and 2b at operation 200 a substrate is provided. The substrate may be as described above with respect to FIG. 1. Normally, a substrate can be ordered from suppliers with a specified amount of p-type or n-type conductivity. According to various embodiments, the substrate may be doped with p-type dopant to form a p-type base layer 10. The dopant concentration may be in a range from $10^{15}$ to $10^{17}$ atoms per cubic centimeter ($atoms/cm^3$). The thickness of the substrate may be in a range from 50 to 500 µm, although savings of semiconductor material can be achieved relative to current standard substrates by using substrates with a thickness from 50 to less than 200 µm. Resistivity of the substrate may be in a range from 1 to 100 Ohm-cm, with excellent results obtained using 1 to 3 Ohm-cm. Monocrystalline or multicrystalline, or possibly string ribbon, thin-film or other types of substrates, may be used.

At operation 200, the substrate may be cleaned to prepare it for processing. The cleaning may be accomplished by immersion of the substrate in a bath of potassium hydroxide (KOH) having, for example, about a 1-10% concentration, to etch away saw damage on the surfaces of the substrate.

According to some example embodiments, etching may be conducted at a temperature from about 60 to 90 degrees Celsius.

At operation 205, the substrate may be textured. For example, the substrate may be textured by anisotropically etching it by immersion in a bath of potassium hydroxide and isopropyl alcohol (KOH-IPA). According to some example embodiments, the potassium hydroxide concentration may be about a 1-10% concentration, and the isopropyl alcohol may be about a 2-20% concentration. The temperature of the KOH-IPA bath may be about 65 to 90 degrees Celsius. The KOH-IPA etches the surfaces of the substrate to form pyramidal structures with faces at the crystallographic orientation. The resulting pyramidal structures help to reduce reflectivity at the front surface and to trap light within the substrate where it can be absorbed for conversion to electric energy.

At operation 210, dopant, for example dopant atoms or ions, may be introduced to the front surface of the base layer 10. According to various embodiments, the dopant may be introduced by ion implantation. The dopant may have a conductivity type opposite to that of the base layer 10. Thus, if the base layer 10 has p-type conductivity, then the dopant introduced in operation 210 may have n-type conductivity. Conversely, if the base layer 10 has n-type conductivity, then the dopant may have p-type conductivity. In certain embodiments, the n-type dopant may be phosphorus ions, for example $P^{31+}$. According to various embodiments, patterning of the selective regions 15 and the field regions 20 may be achieved by two ion implantation steps. For example, the selective emitter layer may be formed by performing a first ion implantation step uniformly over the front surface of the p-type base layer 10 followed by performing a second ion implantation step in just the selective regions 15. Alternatively, patterning of both fields may be achieved in a single ion implantation step. For example, a single ion implantation step may be performed where the ion implanter implants at a higher dose or uses a slower beam rate when passing over the selective regions 15.

In embodiments where two ion implantation steps are performed, the first ion implantation may be performed uniformly over the front surface of the p-type base layer 10 at a dose of about $1.0 \times 10^{15}$ cm$^{-2}$ to $1.0 \times 10^{16}$ cm$^{-2}$. Beam acceleration may be performed at a range of 5 kiloelectron-volts (keV) to 30 keV. After the field regions 20 have been doped, the second ion implantation step may be performed to dope the selective regions 15. Patterning of the selective regions 15 may be achieved by performing the ion implantation through a mask, for example a graphite mask. The use of a superstrate graphite mask may allow the substrate to remain loaded in the ion implanter for both ion implantation steps without removal between the two steps. The graphite mask may have openings from 50 to 500 micrometers wide and having a length equal to or greater than the width of the substrate, for example 156 millimeters.

The second ion implantation step may be performed at a higher dose than the first ion implantation step, for example using a dose of $0.7 \times 10^{15}$ cm$^{-2}$ to $1 \times 10^{16}$ cm$^{-2}$. Additionally, beam acceleration during the second ion implantation step may be performed at a range of 5 keV to 30 keV. According to various embodiments, during the ion implantation of operation 210, one edge of the substrate, known as the reference edge, may be aligned with the edge of the mask by gravity. Additionally, fiducials may be created on the reference edge, for example using a laser tool, which may be referenced in downstream process steps involving alignment. In alternative embodiments, the dose used during the second ion implantation step may be less than or equal to the dose of the first ion implantation step because the first ion implantation step may have already lightly doped the selective regions 15. Therefore, any dose used during the second ion implantation step that provides additional dopant to the selective regions 15 may ensure that the selective regions 15 are more heavily doped than the field regions 20.

At operation 215, the implanted substrate may be subjected to a heating step to form a p-n junction 25 and a selective emitter. According to some embodiments, the substrate may be introduced into a furnace for annealing, for example an automated quartz tube furnace. The inner diameter of the quartz tube may be about 290 millimeters to accommodate 156 millimeter pseudosquare substrates. The annealing operation 215 may be used to accomplish several objectives at once. First, the annealing operation 215 may activate the implanted dopant ions, that is, the heat energy of the anneal operation creates vacancies in the silicon lattice for the dopant ions to fill. Second, the annealing may drive the dopant ions deeper, for example to a desired junction depth, into the substrate to form the p-n junction 25. Third, the annealing operation 215 may repair damage to the crystalline lattice of the substrate caused by ion implantation. Fourth, the annealing operation 215 may be used to grow passivating oxide layers 40, 41 on the front surface of the doped regions 15, 20 of the selective emitter layer and the back surface of the p-type base layer 10.

According to example embodiments, the annealing operation 215 may begin by loading 1 to 400 substrates into a furnace at a temperature in the range of 550 to 800 degrees Celsius. In some embodiments, a large number of substrates may be simultaneously loaded into the furnace, for example up to 400 substrates may be loaded during a single furnace cycle. Once the substrates are loaded into the furnace, the temperature may be ramped up to a temperature in the range of 700 to 825 degrees Celsius over a period of 10 to 30 minutes. This temperature may then be maintained for 10 to 30 minutes. Next the temperature may be ramped up to a temperature in the range of 825 to 1050 degrees Celsius over a period of 10 to 30 minutes and maintained at that temperature for 10 to 30 minutes. During this time, while the temperature is being maintained, oxygen may be introduced to the furnace, for example oxygen gas or water vapor may be introduced. The oxygen may be introduced at a flow rate of 100 to 5000 standard cubic centimeters per minute (sccm). The introduced oxygen may grow in situ passivating oxide layers 40, 41 on the front surface of the doped regions 15, 20 of the selective emitter layer and the back surface of the p-type base layer 10, because the use of ion implantation rather than diffusion does not result in the formation of a glass layer that would need to be removed prior to forming an oxide layer. Finally, the temperature may be ramped down to a temperature in the range of 600 to 700 degrees Celsius over a period of 30 to 120 minutes. The substrates may then be removed from the furnace.

According to various embodiments, the ion implantation dose and energy of operation 210 along with the furnace conditions of operation 215 may affect the sheet resistances in the field regions 20 and selective regions 15. For example, operations 210 and 215 may produce a solar cell 5 with field regions 20 having a sheet resistance of 80 to 120 Ohms-per-square and selective regions 15 having a sheet resistance of 30 to 80 Ohms-per-square.

At operation 220, an antireflection layer 45 may be formed on the front passivating oxide layer 40. The antireflection layer 45 may have an index of refraction higher than the oxide layer 40 but lower than the silicon substrate, thus enabling more light to pass into the antireflection layer 45 and through the oxide layer 40 to the substrate where it can be converted to free charge carriers. The antireflection layer 45 may be composed of silicon nitride ($SiN_X$), aluminum oxide ($Al_2O_3$), titanium oxide ($TiO_2$), magnesium fluoride ($Mg_2F$), or zinc sulfide ($ZnS_2$), or combinations of these materials. In certain embodiments, the antireflection layer 45 may comprise an amorphous nitride, such as amorphous silicon nitride (a-$SiN_X$). The antireflection layer 45 may be formed by plasma enhanced chemical vapor deposition (PECVD). Alternatives to the PECVD process may include low pressure chemical vapor deposition (LPCVD), sputtering, and the like. The PECVD process may include heating the substrate to a temperature in the range of 300 to 500 degrees Celsius. Additionally, the PECVD process may include using silane and ammonia reactant gases. The antireflection layer 45 may have a thickness from 60 to 70 nanometers and an index of refraction of about 2.00. The thickness and index of refraction of the antireflection layer 45 may be determined by parameters such as deposition time, plasma power, flow rate of reactant gasses, and the deposition pressure.

At operation 225, the material for the front contacts 30 and front connections of the solar cell 5 may be applied to the front surface of the antireflection layer 45. According to various embodiments, the front contacts 30 and front connections may be screen-printed using a semi-automatic screen printer with optical alignment. The front contacts 30 and front connections may be applied using a silver paste, for example Heraeus SOL953 or the like. In some embodiments, the silver paste may be a fritted silver paste to help penetrate the front passivating oxide layer 40 and the antireflection layer 45 during firing of the contacts. The silver paste may be optimized specifically for forming contacts to emitters with low phosphorus doping. The configuration and spacing of the front contacts 30 and front connections may be defined by the contact pattern of the screen. In certain embodiments, the front contacts 30 can be 50 to 150 micrometers in width and spaced apart by 1.5 to 2.5 millimeters. The paste for the front contacts 30 and the front connections may be subsequently dried with a belt furnace. Alternatively, the front contacts 30 and front connections may be dried simultaneously with the back contact 35 and back connections, as described in operation 230 below.

In various example embodiments, the pattern of the screen, such as a grid pattern, line pattern, or the like, may be designed specifically for the selective emitter layer formed by the method described above. For example, the pattern of the front contacts 30 may be designed so that they are aligned and printed within the selective regions 15 of the selective emitter layer. In certain embodiments, the width of the front contacts 30 may be less than the width of the selective regions 15 to ensure that the front contacts 30 are entirely within the selective regions 15. The heavy doping in these selective regions 15 also may increase the depth of the p-n junction 25 underneath, which may prevent shunting or firing through the p-n junction 25 by components of the metal paste used to form the front contacts 30. According to example embodiments, alignment of the front contacts 30 with the selective regions 15 of the selective emitter layer may be accomplished through a variety of techniques known to those of ordinary skill, including optical alignment using the reference edge described above in operation 210 or another fiducial mark formed on the solar cell 5 to indicate a position relative to which alignment is to be performed, butt-edge alignment against two posts, alignment by camera to the center or edge of the substrate, or the like.

At operation 230, the material for the back contact 35 and back connections may be applied to the back surface of the p-type base layer 10. In certain embodiments, the back contact 35 and back connections may be screen-printed on the back passivating oxide layer 41 on the back surface of the p-type base layer 10. The back contact 35 may be applied using an aluminum paste, for example Monocrystal Analog 12D or the like. Additionally, the back connections may be applied using an aluminum-silver paste, for example Monocrystal PPAS-7-1 or the like. According to example embodiments, the back connections, such as solderable pads and bus bars, may be applied to the back surface of the p-type base layer 10 prior to the application of the back contact 35. The back contact 35 may be printed to overlap the edges of the back connections while leaving a portion of the back connections exposed. In example embodiments, the back contact 35 and back connections may be screen-printed across nearly the entire back surface of the p-type base layer 10. In these embodiments, the aluminum paste of the back contact 35 may not be printed over a narrow border near the edges of the wafer approximately 1 mm wide. Alternatively, the back contact 35 and back connections may be printed across only a portion of the back surface of the p-type base layer 10. The solar cell 5 may optionally be placed on a belt furnace at a temperature of 150 to 350 degrees Celsius in air ambient for 30 to 300 seconds to dry the printed paste.

At operation 235, the substrate with the contacts 30, 35 and connections applied may be heated or co-fired in a belt furnace, such as an in-line belt furnace or the like. In the process of co-firing the structure, the front contacts 30 and front connections may fire through the front passivating oxide layer 40 and the antireflection layer 45 to form a physical connection with the doped regions 15, 20 of the selective emitter layer. In various embodiments, the front contacts 30 may only make physical connection with the selective regions 15 of the selective emitter layer. To facilitate firing through the oxide layer 40 and the antireflection layer 45, the front contacts 30 and front connections may contain frit, such as glass frit or the like. The glass frit in the paste used to form the front contacts 30 and front connections may melt at a temperature near 500 degrees Celsius and dissolve the underlying oxide layer 40 and antireflection layer 45. The firing temperature may be chosen such that the metal particles, such as silver, in the front contact paste form ohmic contact with the selective emitter layer without migrating below the depth of the emitter.

During the co-firing at operation 235, the material of the back contact 35 and back connections may form a physical contact with the back surface of the p-type base layer 10. In the process of co-firing the structure, the back contact 35 and back connections may fire through the back passivating oxide layer 41 to form a physical connection with the back surface of the p-type base layer 10. As a result, the back passivating oxide layer 41 may be consumed by the back contact 35 and back connections material, for example by the glass frit in the pastes. In certain embodiments, the firing of the back contact 35 and back connections may occur above the aluminum-silicon eutectic temperature of 577 degrees Celsius. When the substrate cools following the co-firing, an aluminum-doped $p^+$ silicon back surface field layer 50 may form on the back surface of the p-type base layer 10 by liquid phase epitaxial re-growth. In these embodiments, the back contact 35 may be in electrical communication with the back surface field layer 50. The temperature profile may feature a high heating rate, in the range of 20 degrees Celsius per second to 150 degrees Celsius per second, that promotes formation of a uniform p-$p^+$ interface between the textured back surface of the p-type base layer 10 and the back surface field layer 50. Additionally, an aluminum back contact 35 may also be formed on the back surface of the back surface field layer 50 during cooling.

The front and back connections may also become sintered or bonded to respective front and back contacts 30, 35 so that they are integrally connected and form good electrical connection to respective front and back sides of the solar cell 5. Connections may be adjoined via soldered wires to adjacent solar cells in a solar module and ultimately to a load to provide power thereto upon exposure of the solar cell to light.

According to various embodiments, and as described above, a solar cell with ion implanted selective emitter and high-quality in situ passivation layer formed in a single anneal cycle may be formed. Many advantages may be realized by forming the selective emitter and oxide layer as described herein. For example, according to various embodiments, the selective emitter layer and high-quality, passivating oxide layer may be formed in a single high-temperature anneal step. Additionally, according to certain embodiments, the problem of phosphosilicate glass removal and edge isolation may be solved by the processes described herein. Moreover, according to various embodiments, a solar cell may be produced in a single anneal step having a selective emitter layer and passivating oxide layer with a potential cell efficiency of about 20% on 156 millimeter pseudosquare substrates, even with low-cost, but high-quality, screen-printed contacts. Furthermore, these improvements greatly reduce the amount of time, equipment and expense needed to produce the solar cell, and greatly increase the throughput of the manufacturing process.

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of steps, elements, and/or materials than those explicitly described above are also contemplated as may be set forth in some of the appended claims. Accordingly, the specification and drawings are to be regarded in an illustrative rather than restrictive sense. Although specific terms are employed herein, they are used in a generic and descriptive sense only and not for purposes of limitation.

What is claimed is:

1. A method for manufacturing a solar cell comprising:
   providing a substrate comprising a base layer;
   introducing dopant to the front surface of the base layer by ion implantation, wherein the dopant introduced is of n-type conductivity;
   annealing the substrate, wherein annealing comprises heating the substrate in a furnace to a temperature to:
      anneal the implant damage; and
      activate the introduced dopant, thereby forming an n-type doped layer into the front surface of the base layer;
   introducing oxygen into the furnace during the annealing step to:
      form a passivating oxide layer on at least the front surface of the n-type doped layer;
   screen-printing one or more back contacts on the back surface of the base layer;
   forming a p-type doped layer at the interface of the back surface of the base layer and the one or more back contacts during firing of the one or more back contacts, wherein the one or more back contacts provide an electrical connection to the p-type doped layer.

2. The method of claim 1 wherein the substrate is a crystalline silicon substrate.

3. The method of claim 1, wherein the base layer conductivity is p-type.

4. The method of claim 1, wherein the base layer conductivity type is n-type.

5. The method of claim 1, further comprising:
   depositing a silicon nitride layer on the front surface of the passivating oxide layer thereby forming an antireflection layer.

6. The method of claim 1, further comprising:
   screen-printing one or more front contacts on the silicon nitride layer, wherein firing the one or more back contacts further comprises firing the one or more front contacts to provide an electrical connection to the n-type doped layer.

7. The method of claim 1, wherein the one or more back contacts comprise aluminum, and wherein the p-type doped layer comprises aluminum and silicon.

8. A method for manufacturing a solar cell comprising:
   providing a substrate comprising a base layer;
   introducing dopant to the front surface of the base layer by ion implantation, wherein the dopant introduced is of n-type conductivity;
   annealing the substrate, wherein annealing comprises heating the substrate in a furnace to a temperature to:
      anneal the implant damage; and
      activate the introduced dopant, thereby forming an n-type doped layer into the front surface of the base layer;
   introducing oxygen into the furnace during the annealing step to:
      form a rear passivating oxide layer on at least the back surface of the base layer;
   screen-printing a metal paste over the one or more regions of the rear passivating oxide layer; and
   firing the metal paste to:
      form one or more local back contacts, wherein the metal paste penetrates the rear passivating oxide layer; and
      form one or more local p-type doped regions at the interface of the back surface of the base layer and the one or more local back contacts, wherein the one or more local back contacts provide an electrical connection to the one or more local p-type doped regions.

9. The method of claim 8 wherein the substrate is a crystalline silicon substrate.

10. The method of claim 8, wherein the base layer conductivity is p-type.

11. The method of claim 8, wherein the base layer conductivity type is n-type.

12. The method of claim 8, further comprising:
   forming a front surface passivating oxide layer on the front surface of the n-type doped layer;
   depositing a silicon nitride layer on the front surface of the front surface passivating oxide layer thereby forming an antireflection layer.

13. The method of claim 8, further comprising:
   screen-printing one or more front contacts on the amorphous silicon nitride layer, wherein firing the one or more back contacts further comprises firing the one or more front contacts to provide an electrical connection to the n-type doped layer.

14. The method of claim 8, wherein the metal paste comprises aluminum, and wherein the one or more local p-type doped regions comprises aluminum and silicon.

15. A method for manufacturing a solar cell comprising:
providing a substrate comprising a base layer;
introducing dopant to the front surface of the base layer by ion implantation, wherein the dopant introduced is of n-type conductivity;
annealing the substrate, wherein annealing comprises heating the substrate in a furnace to a temperature to:
 anneal the implant damage; and
 activate the introduced dopant, thereby forming an n-type doped layer into the front surface of the base layer;
screen-printing one or more back contacts on the back surface of the base layer;
forming a p-type doped layer at the interface of the back surface of the base layer and the one or more back contacts during firing of the one or more back contacts,
wherein the one or more back contacts provide an electrical connection to the p-type doped layer.

16. The method of claim 15 wherein the substrate is a crystalline silicon substrate.

17. The method of claim 15, wherein the base layer conductivity is p-type.

18. The method of claim 15, wherein the base layer conductivity type is n-type.

19. The method of claim 15, further comprising:
introducing oxygen into the furnace during the annealing step to:
 form a passivating oxide layer on at least the front surface of the n-type doped layer.

20. The method of claim 15, wherein the one or more back contacts comprise aluminum, and wherein the p-type doped layer comprises aluminum and silicon.

\* \* \* \* \*